United States Patent
Mao

(10) Patent No.: US 9,508,585 B2
(45) Date of Patent: Nov. 29, 2016

(54) APPARATUS OF SEPARATING FLEXIBLE SUBSTRATE FROM GLASS SUBSTRATE AND MANUFACTURING EQUIPMENT THEREOF

(71) Applicant: BOE TECHNOLOGY GROUP CO., LTD., Beijing (CN)

(72) Inventor: Xue Mao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 212 days.

(21) Appl. No.: 14/355,072

(22) PCT Filed: Dec. 16, 2013

(86) PCT No.: PCT/CN2013/089470
§ 371 (c)(1),
(2) Date: Apr. 29, 2014

(87) PCT Pub. No.: WO2015/021713
PCT Pub. Date: Feb. 19, 2015

(65) Prior Publication Data
US 2016/0118286 A1    Apr. 28, 2016

(30) Foreign Application Priority Data
Aug. 13, 2013 (CN) .......................... 2013 1 0351487

(51) Int. Cl.
*B32B 38/10* (2006.01)
*H01L 21/683* (2006.01)
(Continued)

(52) U.S. Cl.
CPC ......... *H01L 21/6835* (2013.01); *B32B 43/006* (2013.01); *H01L 21/78* (2013.01); *H01L 27/1218* (2013.01); *B32B 2315/08* (2013.01); *B32B 2457/20* (2013.01);
(Continued)

(58) Field of Classification Search
CPC ........... G02F 1/1303; G02F 1/133305; Y10T 156/1174; Y10T 156/195; Y10S 156/93; Y10S 156/941; B32B 38/10; B32B 43/006
See application file for complete search history.

(56) References Cited

U.S. PATENT DOCUMENTS 4,165,251 A * 8/1979 Matsumoto ............. G03F 7/343
156/715
5,540,809 A * 7/1996 Ida ...................... B29C 63/0013
156/715
(Continued)

FOREIGN PATENT DOCUMENTS

CN            102915965 A    2/2013

OTHER PUBLICATIONS

English Translation of the International Search Report of PCT/CN2013089470 published in English on Feb. 19, 2015.
(Continued)

*Primary Examiner* — Mark A Osele
(74) *Attorney, Agent, or Firm* — Collard & Roe, P.C.

(57) ABSTRACT

An apparatus of separating a flexible substrate from a glass substrate comprises a cylinder-shaped roller; and a control unit connected to the roller configured to control a rotation of the roller so as to separate a flexible substrate from a glass substrate by the rotation of the roller; the roller has a cylinder surface provided with a depressed area thereon, and the depressed area is configured to allow a driver IC on the flexible substrate to be received by the depressed area during the rotation of the roller, thereby preventing the driver IC from being damaged.

9 Claims, 3 Drawing Sheets

(51) Int. Cl.
  *H01L 21/78* (2006.01)
  *B32B 43/00* (2006.01)
  *G02F 1/1333* (2006.01)
  *G02F 1/13* (2006.01)
  *H01L 27/12* (2006.01)

(52) U.S. Cl.
  CPC ...... *G02F 1/1303* (2013.01); *G02F 1/133305* (2013.01); *H01L 27/1266* (2013.01); *H01L 2221/6835* (2013.01); *H01L 2221/68395* (2013.01); *Y10S 156/93* (2013.01); *Y10S 156/941* (2013.01); *Y10T 156/1174* (2015.01); *Y10T 156/195* (2015.01)

(56) References Cited

U.S. PATENT DOCUMENTS

| | | | | |
|---|---|---|---|---|
| 5,673,908 A | * | 10/1997 | Nagata | B65H 3/10 271/107 |
| 5,762,330 A | * | 6/1998 | Quackenbush | B65H 3/10 271/188 |
| 5,824,184 A | * | 10/1998 | Kamijo | B29C 63/0013 156/249 |
| 5,891,297 A | * | 4/1999 | Stadtmueller | B29C 63/0013 156/715 |
| 5,931,635 A | * | 8/1999 | Barthold | B65H 3/10 271/18.3 |
| 8,142,610 B2 | * | 3/2012 | Tani | B08B 7/00 156/715 |
| 8,641,851 B2 | | 2/2014 | Lee et al. | |
| 2008/0236743 A1 | * | 10/2008 | Kye | B29C 63/0013 156/714 |
| 2008/0296829 A1 | * | 12/2008 | Asari | B65H 3/10 271/95 |
| 2013/0188324 A1 | | 7/2013 | Lee et al. | |

OTHER PUBLICATIONS

Written Opinion of the International Searching Authority of PCT/CN2013/089470, mailed May 23, 2014 (English Translation).
Korean Office Action in Korean Application No. 10-2014-7012863, mailed Jul. 13, 2016 with English translation.

* cited by examiner

APPARATUS OF SEPARATING FLEXIBLE SUBSTRATE FROM GLASS SUBSTRATE AND MANUFACTURING EQUIPMENT THEREOF

CROSS REFERENCE TO RELATED APPLICATIONS

This application is the National Stage of PCT/CN2013/089470 filed on Dec. 16, 2013, which claims priority under 35 U.S.C. §119 of Chinese Application No. 201310351487.3 filed on Aug. 13, 2013, the disclosure of which is incorporated by reference. The international application under PCT article 21(2) was not published in English.

TECHNICAL FIELD

Embodiments of the present invention relate to an apparatus of separating a flexible substrate from a glass substrate, and an equipment of manufacturing the flexible substrate.

BACKGROUND

A flexible substrate (e.g., made of plastic material) is liable to be deformed during a manufacturing process due to its flexibility, thus it is difficult to precisely conduct the manufacturing process. Generally, a flexible substrate is manufactured in such a manner that the flexible substrate is fastened onto a glass substrate firstly and then separated from the glass substrate after the manufacture of display components is finished and a display panel is formed.

As shown in FIG. 1, when separating a flexible substrate from a glass substrate, a way of mechanical peel-off is often used, i.e., one end of the flexible substrate 13 is fastened onto a roller 15 with a certain radius of curvature, the roller 15 is rotated to rise the flexible substrate 13 along therewith so as to separate it from the glass substrate 11. During the separation, since a portion of the driver IC 14 on the flexible substrate 13 is raised up, the component and the like are liable to be damaged due to the excessively large stress subjected by the flexible substrate 13 when the roller 15 presses.

SUMMARY

Embodiments of the present invention provide an apparatus of separating a flexible substrate from a glass substrate, and an equipment of manufacturing the flexible substrate, which are used for realizing that driver ICs on the flexible substrate are not subjected to a press of the roller during a separation of the flexible substrate from the glass substrate, thereby avoiding damage to the flexible substrate during the separation.

An embodiments of the present invention provides an apparatus of separating a flexible substrate from a glass substrate, comprising: a cylinder-shaped roller; and a control unit connected to the roller configured to control a rotation of the roller to separate the flexible substrate from the glass substrate by the roller; wherein the roller has a cylinder surface provided with a depressed area thereon, and the depressed area is configured to allow a driver IC on the flexible substrate to be received by the depressed area during the rotation of the roller.

In an example, the roller is provided with one or more depressed areas thereon, and when the roller is rotated to a driver IC portion, the driver IC is received by the depressed area without subjecting to a press by the roller.

In an example, when the flexible substrate is provided with a plurality of driver ICs thereon, a corresponding depressed area is provided on the roller for each of the driver ICs.

In an example, the depressed area has a dimension which is matched with that of a corresponding driver IC.

In an example, the depressed area has a dimension which is larger than that of the driver IC.

In an example, when the flexible substrate is provided with a plurality of driver ICs thereon and the plurality of driver ICs are provided in a same line, the roller thereon is provided with one depressed area corresponding to a location of the line and the depressed area is configured to prevent the roller from contacting with the plurality of driver ICs located in the line during the rotation of the roller.

In an example, the roller thereon is provided with one depressed area corresponding to a location of the line, the depressed area is in a cuboid-shape with a width of about 2 mm, a depth of about 2 mm, and a length no less than a length occupied by the plurality of driver ICs in the same line.

In an example, the roller includes a first section, a second section, and a third section provided with the depressed area; the third section is movably connected between the first section and the second section, and is rotatable around an axis of cylinder; during the roller is rotated to separate the flexible substrate from the glass substrate, the driver IC on the flexible substrate is received by the depressed area by a rotation of the third section.

Embodiments of the present invention provide an equipment of manufacturing the flexible substrate, comprising any of the above-mentioned apparatuses.

BRIEF DESCRIPTION OF THE DRAWINGS

Embodiments of the present invention will be described in more detail below with reference to the accompanying drawings to enable those skilled in the art to understand the present invention more clearly, wherein.

DETAILED DESCRIPTION OF TEE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," "the" or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Embodiments of the present invention provide an apparatus of separating a flexible substrate from a glass substrate, and an equipment of manufacturing the flexible substrate, which are used for realizing that the driver ICs on the flexible substrate are not subjected to a press from the roller during a separation of the flexible substrate from the glass substrate, thereby avoiding damage to the flexible substrate during the separation.

Figure 1:
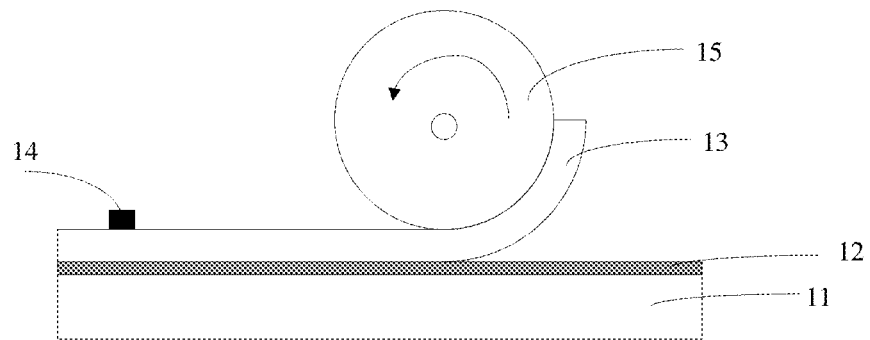
FIG. 1 is a schematic diagram of an apparatus for separating a flexible substrate from a glass substrate in prior art.
Figure 2:
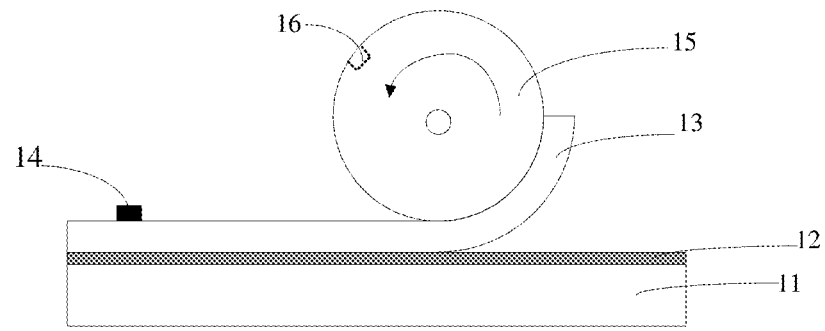
FIG. 2 is a structural side view of an apparatus of separating a flexible substrate from a glass substrate provided in an embodiment of the present invention.

Referring to FIG. 2, an embodiment of the present invention provides an apparatus of separating a flexible substrate from a glass substrate, which comprises a cylinder-shaped roller 15 and a control unit (not shown) connected to the roller for controlling the rotation of the roller so as to separate the flexible substrate from the glass substrate by the roller. The apparatus further comprises a depressed area 16 provided on the cylindrical surface of the roller 15. The depressed area 16 is configured to allow a driver IC 14 on the flexible substrate 13 to be received by the depressed area 16 during the rotation of the roller 15, so as to prevent the roller 15 from contacting with the raised components, such as the driver IC 14, on the flexible substrate 13.

According to an embodiment of the present invention, a control unit (not shown) is provided to be connected to the roller 15 for driving a rotation of the roller 15, so as to separate the flexible substrate 13 from the glass substrate 11 by means of the roller 15. The control unit can be an apparatus, such as an electric motor. The depressed area 16 is configured to prevent the roller 15 from contacting with the driver IC 14 on the flexible substrate 13 during the rotation of the roller 15.

According to embodiments of the present invention, the roller 15 is provided with one or more depressed areas 16 thereon.

According to an embodiment of the present invention, when the flexible substrate 13 is provided with a plurality of driver ICs 14 thereon, corresponding to every driver ICs 14, a depressed area 16 is provided on the roller 15, respectively.

According to an embodiment of the present invention, the depressed area 16 provided for each of the driver ICs 14 has a dimension which is matched with that of the corresponding driver IC 14.

According to an embodiment of the present invention, the depressed area 16 has a dimension which is larger than that of the driver IC 14.

According to an embodiment of the present invention, when the flexible substrate 13 is provided with a plurality of driver ICs 14 thereon and the plurality of driver ICs 14 are located in a same line, the roller 15 thereon is provided with one depressed area 16 corresponding to a location of this line, and the depressed area 16 is configured to prevent the roller 15 from contacting with the plurality of driver ICs 14 located in this line during the rotation of the roller 15. In this way, the roller is provided with one depressed area thereon, which avoids the trouble of arranging a plurality of depressed areas corresponding to every driver ICs, respectively, thereby the manufacturing process is simplified.

According to an embodiment of the present invention, the depressed area 16 provided on the roller 15 is in a cuboid-shape with dimensions that the width is about 2 mm, the depth is about 2 mm, and the length is no less than the length occupied by the plurality of driver ICs 14 in a same line.

Figure 3:
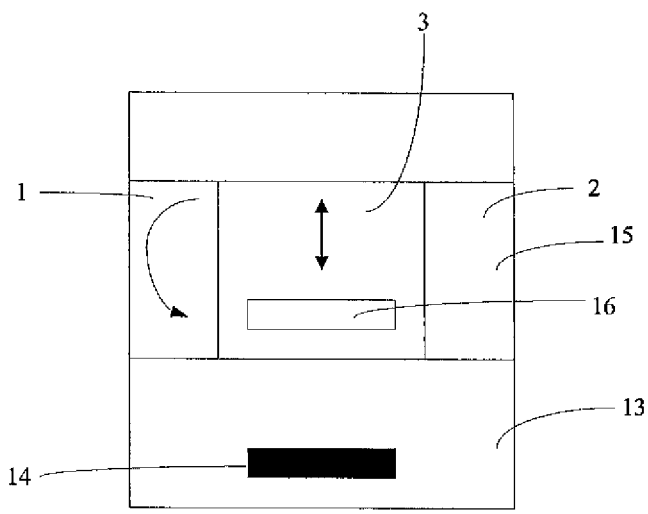
FIG. 3 is a structural top view of an apparatus of separating a flexible substrate from a glass substrate provided in an embodiment of the present invention.

According to an embodiment of the present invention, as shown in FIG. 3, the cylinder of the roller 15 includes a first section 1, a second section 2, and a third section 3 provided with the depressed area 16. In combination with FIG. 4, the third section 3 is movably connected between the first section 1 and the second section 2, and is rotatable around an axis 5 of the cylinder. Since the position where the driver IC 14 is located on the flexible substrate 13 is varying with the size of the flexible substrate 13, during the roller 15 being rotated to drive a separation of the flexible substrate 13 from the glass substrate 11, the driver IC 14 on the flexible substrate 13 is received by the depressed area 16 by means of the rotation of the third section 3, so that the separating apparatus as provided by the embodiment of the present invention is applicable for flexible substrates 13 of different sizes.

Figure 4:
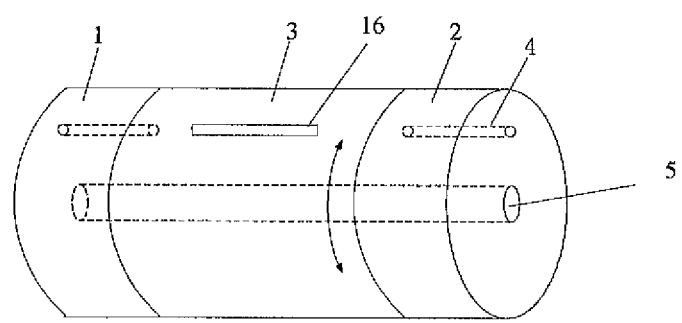
FIG. 4 is a structural perspective view of a roller provided in an embodiment of the present invention.

As shown in FIG. 4, the fastening of the first section 1 and the second section 2 with the third section 3 on the cylinder-shaped roller 15 can be made by inserting a jackscrew 4 from side faces of the first section 1 and second section 2. It should be noted that the roller structure is merely one of the conceived achievable manners and the present invention is not limited in such a structure.

An equipment of manufacturing the flexible substrate, comprising the described apparatus.

The weak contact interface 12 as shown in FIG. 2 is a contact interface between the flexible substrate 13 and the glass substrate 11.

Figure 5:
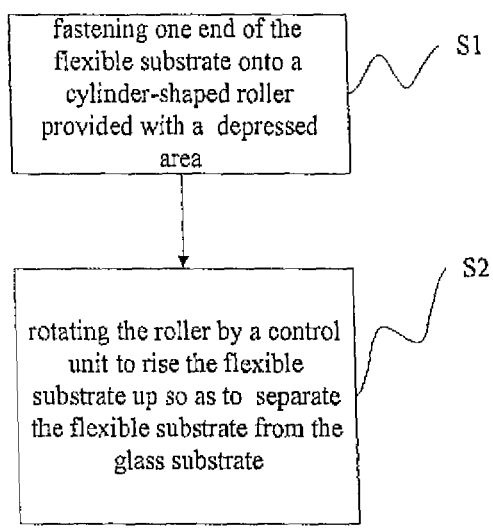
FIG. 5 is a schematic flow chart of a method of separating a flexible substrate from a glass substrate provided by an embodiment of the present invention.

Referring to FIG. 5, an embodiment of the present invention provides a method of separating a flexible substrate from a glass substrate, comprising steps:

S1, fastening one end of the flexible substrate onto a cylinder-shaped roller provided with a depressed area, and S2, rotating the roller by a control unit to rise the flexible substrate along with the roller so as to achieve a separation of the flexible substrate from the glass substrate.

The control unit cooperates to control the rotation of the roller, thereby separating the flexible substrate from the glass substrate by means of the roller. The control unit can be an apparatus, such as an electric motor.

When the roller is rotated to the position of a driver IC provided on the flexible substrate, the driver IC is received by the depressed area provided on the roller so that the driver IC is not subjected to a press from the roller, thereby avoiding damage to the flexible substrate during the separation.

The roller includes a first section, a second section, and a third section provided with the depressed area. The third section is movably connected between the first section and the second section, and is rotatable around an axis of the cylinder. Since the position where the driver IC is located on the flexible substrate is varying with the size of the flexible substrate, during the process in which the roller is rotated to drive a separation of the flexible substrate from the glass substrate, the driver IC on the flexible substrate is received by the depressed area by means of a rotation of the third section, so that the separating apparatus provided by the embodiment of the present invention can be applicable for flexible substrates of different sizes. In this way, since the position where the driver IC is located on the flexible substrate is varying with the size of the flexible substrate, the driver IC on the flexible substrate can be received by the depressed area by means of a rotation of the third section, so that the separating apparatus can be applicable for flexible substrates of different sizes and with driver ICs provided on different locations.

The fastening of the first section and the second section with the third section on the cylinder-shaped roller can be made by inserting a jackscrew from side faces of the first section and second section. It should be noted that the roller structure is merely one of the conceived achievable manners and the present invention is not limited in such a structure.

According to an example, the roller is provided with one or more depressed areas thereon. In this way, it can prevent the roller from contacting with the driver IC(s) on the flexible substrate and from damaging the raised component(s), such as the driver IC(s).

According to an example, when the flexible substrate is provided with a plurality of driver ICs thereon, corresponding to every driver ICs, the roller is provided with a corresponding depressed area thereon, respectively. In this way, when the roller is rotated to the positions of the driver ICs, the plurality of driver ICs are received by the corresponding depressed areas without subjecting to a press from the roller, thereby avoiding damage to the flexible substrate during the separation.

According to an example, the depressed area has a dimension which is matched with that of the corresponding driver IC. In this way, the dimension of the depressed area is just corresponding to the dimension of the driver IC, which allows the driver IC to be received by the depressed area when the roller is rotated to the position of the driver IC. According to an example, the depressed area has a dimension which is larger than that of the driver IC, so that the driver IC can be received by the depressed area when the roller is rotated to the position of the driver IC.

According to an example, when the flexible substrate is provided with a plurality of driver ICs thereon and the plurality of driver ICs are located in a same line, the roller thereon is provided with one depressed area corresponding to a location of this line and the depressed area is configured to prevent the roller from contacting with the plurality of driver ICs located in this line during the rotation of the roller.

According to an example, the depressed area provided on the roller is in a cuboid-shape with dimensions that the width is about 2 mm, the depth is about 2 mm, and the length is no less than a length occupied by the plurality of driver ICs in a same line. In this way, the dimension of the depressed area is just corresponding to the dimension of the plurality of driver ICs in this line, which allows the driver ICs in a same line to be received by the depressed area when the roller is rotated to the location of driver ICs.

Embodiments of the present invention provide depressed area on the roller for allowing the driver IC on the flexible substrate to be received by the depressed area during the rotation of the roller, which prevents the roller from contacting with the driver IC on the flexible substrate, so that the driver IC on the flexible substrate is not subjected to a press of the roller during the separation of the flexible substrate from the glass substrate. In such a way, damage to the flexible substrate during the separation is avoided.

It is understood that the described above are just exemplary implementations and embodiments to explain the principle of the present invention and the invention is not intended to limit thereto. An ordinary person in the art can make various variations and modifications to the present invention without departure from the spirit and the scope of the present invention, and such variations and modifications shall fall in the scope of the present invention.

What is claimed is:

1. An apparatus of separating a flexible substrate from a glass substrate, comprising:
   a cylinder-shaped roller; and
   a control unit connected to the roller configured to control a rotation of the roller to separate the flexible substrate from the glass substrate by the roller;
   wherein the roller comprises a first section, a second section, and a third section provided with a depressed area thereon, and the depressed area is configured to allow an integrated chip (IC) on the flexible substrate to be received therein during the rotation of the roller; the third section is movably connected between the first section and the second section, and is rotatable around an axis of the roller; and the depressed area is configured to receive the IC on the flexible substrate by a rotation of the third section during the roller being rotated to separate the flexible substrate from the glass substrate.

2. The apparatus according to claim 1, wherein the cylinder shaped roller comprises a plurality of depressed areas, each depressed area is for receiving an IC.

3. The apparatus according to claim 2, wherein the depressed area has a dimension for matching with that of a corresponding IC to be received therein.

4. The apparatus according to claim 2, wherein the depressed area has a dimension larger than that of the IC to be received therein.

5. The apparatus according to claim 1, wherein the depressed area has a dimension for matching with that of a corresponding IC to be received therein.

6. The apparatus according to claim 5, wherein the depressed area has a dimension larger than that of the IC to be received therein.

7. The apparatus according to claim 1, wherein the depressed area has a dimension larger than that of the IC.

8. An equipment of manufacturing the flexible substrate, comprising the apparatus according to claim 1.

9. The apparatus according to claim 1, wherein the depressed areas is in a cuboid-shape with a width of about 2 mm, a depth of about 2 mm, and a length no less than a length occupied by the plurality of ICs to be received therein in a same line.

* * * * *